United States Patent
Stäcker et al.

(10) Patent No.: US 6,896,999 B2
(45) Date of Patent: May 24, 2005

(54) METHOD OF EXPOSING A SEMICONDUCTOR WAFER IN AN EXPOSER

(75) Inventors: Jens Stäcker, Dresden (DE); Heiko Hommen, Dresden (DE)

(73) Assignee: Infineon Technologies AG, Munich (DE)

( * ) Notice: Subject to any disclaimer, the term of this patent is extended or adjusted under 35 U.S.C. 154(b) by 39 days.

(21) Appl. No.: 10/465,294

(22) Filed: Jun. 19, 2003

(65) Prior Publication Data

US 2004/0023138 A1 Feb. 5, 2004

(30) Foreign Application Priority Data

Jun. 19, 2002 (DE) ......................................... 102 27 304

(51) Int. Cl.[7] ................................................. G03C 5/00
(52) U.S. Cl. ....................... 430/22; 430/312; 430/314; 430/316; 430/317; 430/318
(58) Field of Search .......................... 430/22, 312, 314, 430/316, 317, 318

(56) References Cited

U.S. PATENT DOCUMENTS

| | | | |
|---|---|---|---|
| 5,597,590 A | 1/1997 | Tanimoto et al. | 425/174.4 |
| 5,738,961 A | 4/1998 | Chen | 430/22 |
| 5,757,480 A | 5/1998 | Shimanaka | 356/237 |
| 5,968,687 A * | 10/1999 | Chang et al. | 430/5 |
| 6,190,836 B1 | 2/2001 | Grenon et al. | 430/311 |

* cited by examiner

*Primary Examiner*—Christopher G. Young
(74) *Attorney, Agent, or Firm*—Laurence A. Greenberg; Werner H. Stemer; Ralph E. Locher

(57) ABSTRACT

A method for exposing a semiconductor wafer in an exposer includes applying a first resist layer on a layer covering an alignment mark. A microscope measuring instrument, which has a visible and an ultraviolet light source, uses the visible light source for aligning the wafer and uses the ultraviolet light source for exposing a region in the first resist layer above the alignment mark without using a mask to free expose the alignment marks. The semiconductor wafer is then developed, the alignment mark is etched free and covered again with a second resist, which is exposed in an exposer in order to transfer a mask structure following an alignment with the alignment mark. The capacity of expensive exposers is thus advantageously increased, and microscope measuring instruments can be used multifunctionally, for example for the free exposure and for the detection of defects.

7 Claims, 3 Drawing Sheets

METHOD OF EXPOSING A SEMICONDUCTOR WAFER IN AN EXPOSER

BACKGROUND OF THE INVENTION

FIELD OF THE INVENTION

The present invention relates to a method of exposing a semiconductor wafer in an exposer. The semiconductor wafer has at least one alignment mark which is disposed in a first layer on the semiconductor wafer and is covered by at least a second layer disposed on the first layer. The invention relates in particular to a method wherein the alignment mark covered by the second layer is exposed in order to improve the quality of the exposure operation.

During the production of integrated circuits, the processes for forming the structures which build up a circuit are subject to strict requirements, in particular with respect to the highest possible accuracy for their positions. As a result of the advances in the development of process techniques and the associated reduction in the size of the structures, the tolerances in the alignment processes, in particular during lithographic projection, are also reduced. For the next technology generation, alignment accuracies of less than 35 nm on the semiconductor wafers have to be achieved. The accuracy requirements are especially stringent for a production on 300 mm semiconductor wafers.

However, the manufacturers of the lithographic projection systems and exposers currently guarantee a system alignment accuracy of, for example, only 22 nm to their customers who are the manufacturers of the integrated circuits. For process technical inaccuracies which have to be managed by the manufacturer of the integrated circuits, there thus remains a tolerance band of only about 15 nm, within which positions have to be maintained reproducibly. There is therefore a particular desire to eliminate influences on the progress of the production processes that result from the preprocess.

Influences to be managed by the system manufacturer such as, for example, the stability of the system, lens distortions and changes, for example, in the substrate stage are, on the other hand, already included in the aforementioned tolerance band of 22 nm.

One example of process-induced influences is represented by alignment marks which are affected detrimentally and which are used for the alignment of a semiconductor wafer in a lithographic exposer. Structures of alignment marks produced in a lithographic step are often covered by further layers in subsequent deposition, etching and/or polishing steps, their profiles being detrimentally affected.

Re-detection by the alignment optics in the exposers in this case is often subject to systematic errors. For example, in the process an alignment mark can be covered by a further layer, so that the contrast of the structure is reduced in a disadvantageous way. Likewise, a polishing step which acts anisotropically on the surface topography can lead to asymmetrical shaping of the edge profiles. This can result in displacement of the position of the alignment marks. The non-stochastic distribution of the edge profiles and the deposition or etching characteristics over the wafer reduce the tolerance band of 15 nm.

One proposed solution is to carry out a so-called free exposure or uncovering exposure of the semiconductor wafer. For this purpose, masks set up specifically for this purpose are provided, exclusively having transparent openings on a glass substrate which correspond to the alignment mark positions on the semiconductor wafer. In an exposer, for example a stepper or scanner, it is precisely those regions of a resist applied to the semiconductor wafer which lie above the alignment marks which are exposed. In a selective etching process, the layer above the alignment marks is then removed, so that the alignment marks are exposed. Following the removal of the resist, the semiconductor wafer with the exposed alignment marks is supplied to the actual exposure process in the exposer.

A free exposure of this type carried out in a conventional way is described, for example, in U.S. Pat. No. 5,968,687.

A particular disadvantage in this case is that the performance of these free exposures reduces the availability of the comparatively expensive exposers for the actual structuring process with planes of an integrated circuit. A throughput of only 100 wafers per hour for free exposures barely justifies the investment of, on average, about four million dollars for such a device.

SUMMARY OF THE INVENTION

It is accordingly an object of the invention to provide a method of exposing a semiconductor wafer in an exposer which overcomes the above-mentioned disadvantages of the heretofore-known methods of this general type and which, firstly, increases the quality of the production of integrated circuits, and, secondly, reduces the expenditure for the production.

With the foregoing and other objects in view there is provided, in accordance with the invention, a method of exposing a semiconductor wafer in an exposer, the method includes the steps of:

providing a semiconductor wafer having at least one alignment mark disposed in a first layer on the semiconductor wafer and being covered by at least a second layer disposed on the first layer;

providing a microscope measuring instrument including an optical lens system, a first light source with a visible wavelength range for a visual detection of the at least one alignment mark, a second light source with a ultraviolet wavelength range for an exposure of a first resist layer, a movable substrate holder, a changeover device for changing over from the first light source to the second light source, and a detector unit;

applying a first resist layer to the second layer, transmitting light from one of the first light source and the second light source through the optical lens system onto the semiconductor wafer in order to expose the first resist layer in a region above the at least one alignment mark and developing the resist layer;

etching the second layer underneath an exposed region above the at least one alignment mark in order to uncover the at least one alignment mark;

removing the first resist layer;

applying a second resist layer to the semiconductor wafer;

aligning the semiconductor wafer in the exposer by using the at least one alignment mark; and exposing the second resist layer in the exposer by projecting a structure from a mask onto the semiconductor wafer.

In other words, according to the invention, there is provided a method of exposing a semiconductor wafer in an exposer, the semiconductor wafer having at least one alignment mark which is disposed in a first layer on the semiconductor wafer and is covered by at least a second layer disposed on the first layer, wherein the method includes the following steps:

providing a microscope measuring instrument having an optical lens system, a light source in the visible wavelength range for the visual detection of the mark, a light source in the ultraviolet wavelength range for the exposure of the first resist layer, a movable substrate holder, a changeover device for changing over from the first to the second light source, a detector unit;

providing the semiconductor wafer;

applying a first resist layer to the second layer;

transmitting the light from one of the two light sources through the optical lens system onto the semiconductor wafer in order to expose the first resist layer in a region above the alignment mark and developing the resist layer;

etching the second layer underneath the exposed region above the alignment mark in order to uncover the alignment mark;

removing the first resist layer;

applying a second resist layer to the semiconductor wafer;

aligning the semiconductor wafer in the exposer by using the at least one alignment mark; and exposing the second resist layer in the exposer by projecting a structure from a mask onto the semiconductor wafer.

As a result of the present invention, the free exposure or uncovering exposure of the alignment marks is no longer carried out in a lithographic projection device such as a scanner or a stepper; instead a microscope measuring instrument is used to carry out the exposure. This microscope measuring instrument includes light sources both in the visible and in the ultraviolet spectral range, between which a change can be made.

While the first resist layer used to define the regions to be exposed for uncovering (free exposure) is photosensitive only in one of the two wavelength ranges, the respective other wavelength range is selected in order to be able to perform coarse or fine alignment of the semiconductor wafer in the microscope measuring instrument. The second light source, which preferably emits light in the ultraviolet wavelength range, is then used for the purpose of projecting the light source into the first resist layer on the semiconductor wafer via the optical lens system without the use of an expensive mask. As a result, the first resist layer is exposed. The light sources can be implemented through the use of laser light, halogen lamps or other narrow-band or broadband light sources. It is also possible to set up narrow-band or broad-band spectral filters, for example on white light sources.

According to the invention, accordingly, commercially available inspection instruments for structures on semiconductor wafers can be used if they have light sources which emit specifically in two different wavelength ranges. In this case, these may either be at least two different light sources or one light source having at least two different filters which can be switched in and which are transparent to light in respectively different wavelength ranges.

The function generally provided in such microscope measuring instruments, of illuminating the semiconductor wafer through the use of the light sources, detecting the reflected light through the use of a detector and evaluating it as an image, according to the invention is in this case provided for only one of the two light sources, preferably with the visible light source. In this case, the function is used to detect a predefined alignment mark for the alignment in the microscope measuring instrument, to measure its position and to compare it with a predefined position for the alignment mark.

The first resist applied in accordance with the invention is subsequently exposed with a change being made to the second wavelength range, instead of an image produced for this wavelength range being created through the use of a detector unit.

The microscope measuring instrument can be a defect inspection instrument, an instrument for measuring the positional accuracy (overlay tool) or an instrument for determining structure widths (critical dimensions), etc. One important criterion in this case is that the light beam guided onto the substrate has a sufficiently small extent and accurate focusing.

This is achieved, for example, by the light from the light source being guided, for example, via a beam splitter in the beam path of the optical lens system and being brought onto the surface of the semiconductor wafer at high resolution. In this case, the extent of the spot of light corresponds to the extent of the light source multiplied by the reduction factor which is given by the optical lens system. Typical values lie in the range between 1 $\mu$m and 400 $\mu$m. Alignment marks used at present for steppers, for example from the ASML company, have a size of 720×70 $\mu$m, substructures also possibly having to be resolved here. Another alignment mark for steppers or scanners is in the form of a cross with a size of 60×60 $\mu$m.

The method according to the invention offers the particular advantage that an inexpensive microscope measuring instrument can be used to permit the so-called free exposure. This increases the instrument capacity on high-value exposers while, through the use of the high level of automation of microscope measuring instruments, efficient free exposure of any desired alignment marks is made possible, even with regard to the future 300 mm production facilities. In particular for future technology generations, therefore, higher quality and a greater tolerance margin in relation to reproducible positional accuracies of structures is achieved.

According to another mode of the invention, during the exposure step in the microscope measuring instrument, a position of the at least one or a further alignment mark is moved into the beam path of the optical lens system by using the substrate holder, the visible light source is switched on, the at least one or further alignment mark is detected with the aid of an aligning unit in order to align the semiconductor wafer in the microscope measuring instrument, a position of the at least one alignment mark is moved into the beam path of the optical lens system through the use of the substrate holder, the ultraviolet light source is switched on, so that the first resist layer is exposed in the region above the at least one alignment mark.

According to yet another mode of the invention, the microscope measuring instrument used is suitable for performing a determination of the density and/or an inspection of defects on a semiconductor wafer.

According to a further mode of the invention, the exposure of the first resist layer is carried out without a step of projecting a mask structure onto the semiconductor wafer.

According to another mode of the invention, the light beam produced by the light source on the surface of the resist has an extent of more than 1 $\mu$m and of less than 400 $\mu$m.

According to yet another mode of the invention, the first resist layer is photosensitive to light in a wavelength range between 193 nm and 365 nm.

Other features which are considered as characteristic for the invention are set forth in the appended claims.

Although the invention is illustrated and described herein as embodied in a method of exposing a semiconductor wafer in an exposer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
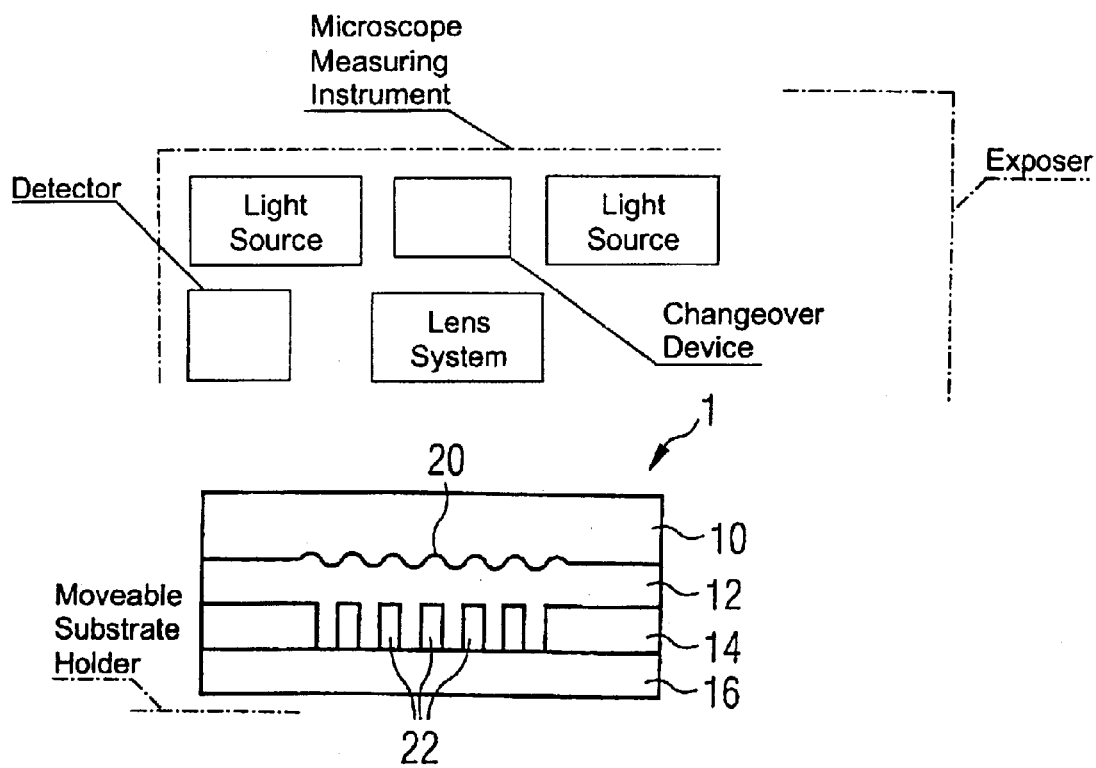
FIGS. 1A to 1E are diagrammatic sectional views of a semiconductor wafer for illustrating a sequence of steps according to the method of the invention.

Referring now to the figures of the drawings in detail and first, particularly, to FIGS. 1A to 1E thereof, there is illustrated, in a sequence of cross-sectional profiles through an alignment mark 22 on a semiconductor wafer 1, a sequence of process steps for exposing the alignment mark 22 for a mask exposure step in an exposer, for example a stepper or scanner. The exposer is only schematically indicated as a dash-dotted line. FIG. 1A shows the state at the start of the sequence of process steps according to the invention. A layer 14, in which the alignment mark 22 is formed, is disposed on a substrate 16 or a buried layer 16. In this case, the figure shows a cross section through an alignment mark 22 including six long, parallel bars. Disposed on the first layer 14 is a second layer 12 which is deposited in a subsequent deposition step, for example to form an interlayer dielectric (ILD).

The structure of the alignment marks 22 in the first layer 14 is reflected in a qualitatively poorer reproduction 20 of the structures on the surface of the second layer 12, because of the conformal deposition. In order to expose the alignment mark 22, first of all a first resist layer 10 is therefore deposited on the second layer 12. The first resist layer 10 is what is known as a DUV resist (deep UV), which is photosensitive at a wavelength of 248 nm.

In a second step, the semiconductor wafer 1 is loaded into a programmable defect density microscope which has been provided previously. This is, for example, an instrument of the model type INS3000 from the company LEICA. In the defect density microscope measuring instrument, first of all what is known as global alignment (coarse alignment) of the semiconductor wafer 1 is carried out. For this purpose, for example a corner, edge or other identifying indentation on the semiconductor wafer 1 can be used.

The microscope measuring instrument has a movable substrate holder (stage), which is only schematically illustrated in FIG. 1A. The semiconductor wafer 1 includes a set of alignment marks which are suitable for the alignment in the defect density microscope. Their positional coordinates, which originate from the product layout data, are entered into a control sequence of the microscope and moved to one after another through the use of the substrate holder. A detector unit (only schematically illustrated), for example an image evaluation system, in the microscope measuring instrument detects the stored alignment marks on the basis of their shape and compares their measured positions with the predefined positional coordinates. After all the marks have been moved to, fine alignment of the semiconductor wafer 1 is performed by using the measured differences from the layout data. The detection of the alignment marks is carried out with visible light, which originates from a halogen lamp.

Since the first resist layer 10 is not photosensitive with respect to the visible light at a frequency between 430 nm and 700 nm, the first resist layer 10 is not exposed. On the other hand, the detector unit is able to detect the shape of the alignment marks under the first resist layer 10 by using the light reflected on the substrate.

Next, in a second control sequence, which is ideally combined with the first control sequence, the positional coordinates of the alignment marks according to the invention are entered. These alignment marks, of which there are, for example, around 5, may be but do not have to be identical with the aforementioned alignment marks, which are used only for the alignment in the defect density microscope. There are, for example, 20 of them.

By using the control sequence, the movable substrate holder moves the 5 alignment marks into the beam path of the optical lens system of the microscope measuring instrument. Without an image being recorded, a light source with ultraviolet light (deep UV) of 248 nm is then switched on for a time period between 3 and 10 seconds. The resolution of the spot of light is 10 $\mu$m. The alignment marks 22 are, for example, marks 22' (see also FIGS. 2 and 3), which are often used for alignment in an ASML stepper or scanner with a size of 640×640 $\mu$m, under the designation PM marks (primary marks). Above the alignment marks, a region 30 in the resist over the alignment marks is scanned point by point through the substrate holder in the present exemplary embodiment, each point having a diameter of 10 $\mu$m.

It is also possible to carry out a linear scanning operation, the duration of the exposure of a point depending on the beam diameter and the scanning speed. The scanning is carried out in accordance with the coordinates of the alignment marks originating from the product layout.

A further possibility is the use of microscope tubes with variably adjustable magnifications, so that through the use of a single, linear, continuous scan, the 40 $\mu$m-wide alignment marks 22 can be exposed. There are, for example, marks from the CANON company with a size of about 35 $\mu$m×120 $\mu$m. Accordingly, a single scan over these alignment marks along a 35 $\mu$m-wide path on the substrate is sufficient.

A further advantageous embodiment is using a microscope tube of 65 $\mu$m diameter for the so-called free exposure of a so-called XY mark 22, which is 60×60 μm in size. Here, according to the invention, a shutter fitted in the microscope can simply be opened and closed only once.

Figure 1B:
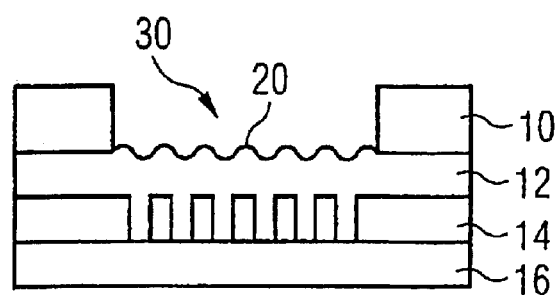

The semiconductor wafer 1 is then unloaded and developed in a developer (see FIG. 1B). The region 30 above the alignment mark 22 is removed from the first resist layer 10 in the process.

Figure 1C:
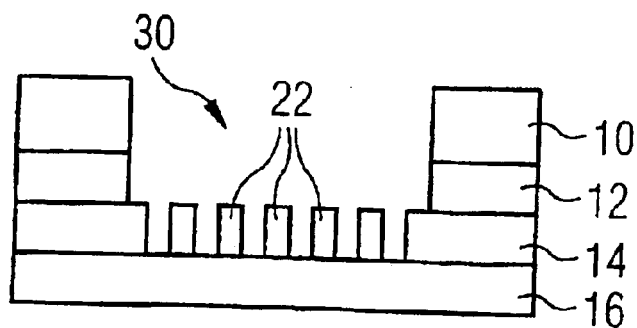
Figure 1D:
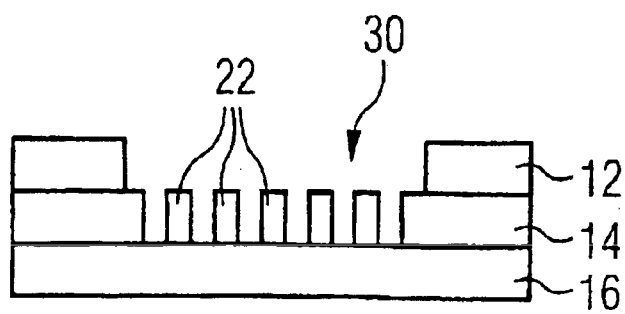

The desired structure in the region 30 is then transferred into the second layer 12 in an etching operation. The etching operation etches the second layer 12 selectively with respect to the first layer 14. The alignment mark 22 is therefore exposed, as is shown in FIG. 1C.

Figure 1E:
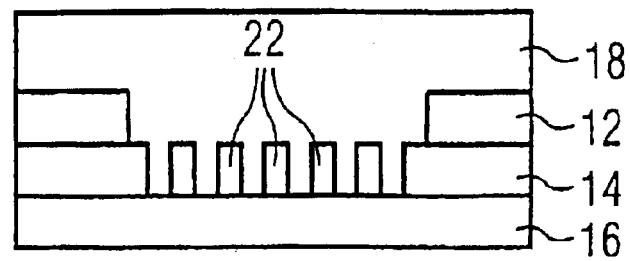

Following the removal of the first resist 10 (FIG. 1D), a second resist 18 is applied, which is photosensitive at 193 nm and is used for the exposure operation in an exposer such as a stepper or scanner (FIG. 1E). The semiconductor wafer 1 is then supplied to the exposer and, by using the exposed five alignment marks 22, is aligned on a substrate holder in the exposer. Exposure is then carried out with a mask in a lithographic projection step.

Figure 5:
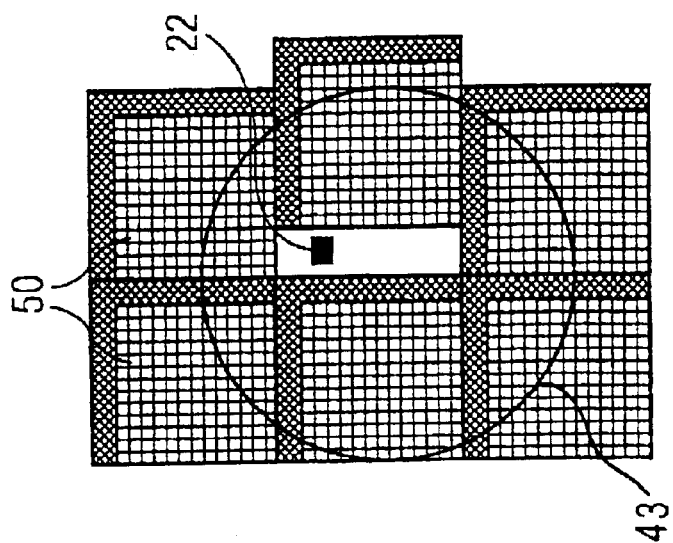
FIG. 5 is a diagrammatic plan view of a detail of the semiconductor wafer shown in FIG. 2 illustrating a placement of an alignment mark between exposure fields that have been shifted apart.
Figure 2:
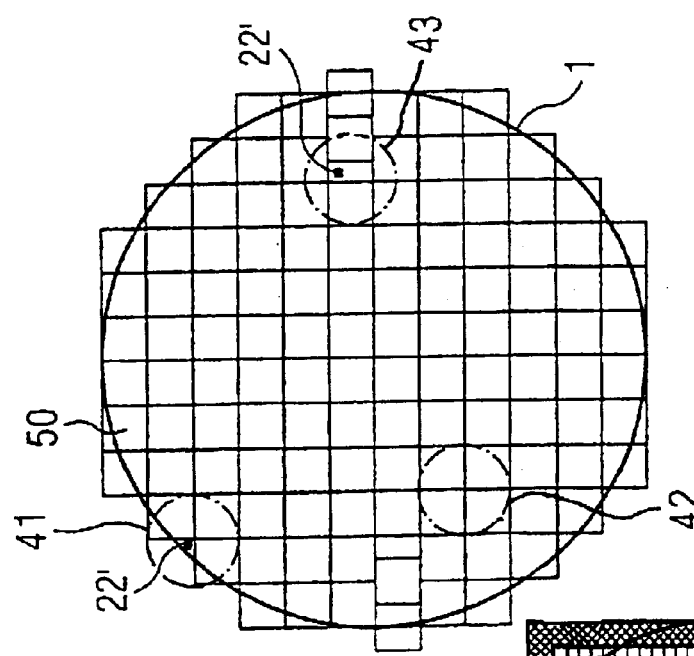
FIG. 2 is a diagrammatic plan view of a semiconductor wafer illustrating an advantageous exemplary embodiment of the placement of alignment marks in a grid of exposure fields for a stepper or scanner.
Figure 3:
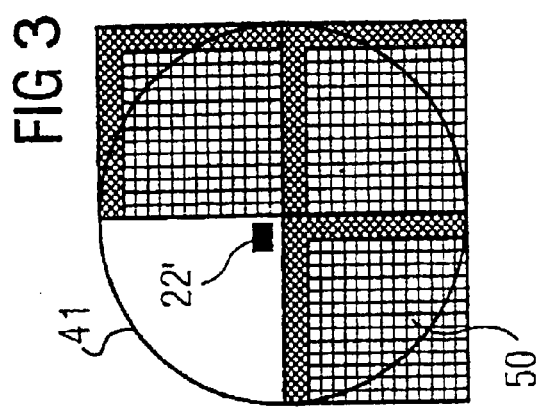
FIG. 3 is a diagrammatic plan view of a detail of the semiconductor wafer shown in FIG. 2 illustrating a placement of an alignment mark on the edge of the semiconductor wafer.
Figure 4:
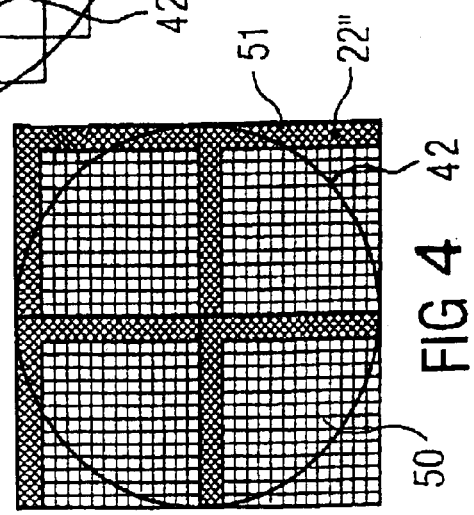
FIG. 4 is a diagrammatic plan view of a detail of the semiconductor wafer shown in FIG. 2 illustrating a placement of an alignment mark in a sawing frame between exposure fields on the semiconductor wafer.

FIG. 2 shows an advantageous placement of alignment marks in a matrix of exposure fields on a semiconductor wafer according to the method of the present invention. FIGS. 3 to 5 show details of the semiconductor wafer 1 in order to illustrate how the alignment marks 22, 22', 22'' are placed with respect to the exposure fields. The details are identified by circles 41, 42, and 43. FIG. 3 illustrates how the alignment marks 22' may lie in free regions between the exposure fields 50, for example in edge regions of the semiconductor wafer 1, which in each case no longer offer sufficient space for the exposure of a complete exposure field. As shown in FIG. 5, an advantageous positioning of the marks in the center of the wafer becomes possible if exposure fields 50 are displaced outward row by row to just such an extent that no exposure field 50 is lost over the edge as a result of displacement.

The alignment marks 22' are PM marks of the ASML company with a size of 640 μm×640 μm. FIGS. 2 and 4 also show alignment marks 22'' from the ASML company which have a size of 720 μm×70 μm (SPM marks, scribeline primary marks). These alignment marks therefore have a sufficiently small width that they fit into the sawing frames 51, which are for example 90 μm wide, between the exposure fields 50.

This example illustrates the particular advantage of the present invention, namely that no explicitly produced free exposure mask is used in order to carry out the so-called free exposures for uncovering the alignment marks. Since the microscope measuring instrument moves dynamically to the positional coordinates and exposes them, the method according to the invention can be used efficiently in the case of mask sets having frequent layout changes, even in the region of the alignment marks. It is not necessary to order a new free exposure mask each time the layout is changed.

We claim:

1. A method of exposing a semiconductor wafer in an exposer, the method which comprises:

providing a semiconductor wafer having at least one alignment mark disposed in a first layer on the semiconductor wafer and being covered by at least a second layer disposed on the first layer;

providing a microscope measuring instrument including an optical lens system, a first light source with a visible wavelength range for a visual detection of the at least one alignment mark, a second light source with a ultraviolet wavelength range for an exposure of a first resist layer, a movable substrate holder, a changeover device for changing over from the first light source to the second light source, and a detector unit;

applying a first resist layer to the second layer, transmitting light from one of the first light source and the second light source through the optical lens system onto the semiconductor wafer in order to expose the first resist layer in a region above the at least one alignment mark and developing the resist layer;

etching the second layer underneath an exposed region above the at least one alignment mark in order to uncover the at least one alignment mark;

removing the first resist layer;

applying a second resist layer to the semiconductor wafer;

aligning the semiconductor wafer in the exposer by using the at least one alignment mark; and exposing the second resist layer in the exposer by projecting a structure from a mask onto the semiconductor wafer.

2. The method according to claim 1, which comprises:

using the microscope measuring instrument for an exposure step including:

moving a position of an alignment mark selected from the group consisting of the at least one alignment mark and a further alignment mark into a beam path of the optical lens system by using the movable substrate holder;

switching on the first light source;

detecting the alignment mark selected from the group consisting of the at least one alignment mark and the further alignment mark by using an aligning unit in order to align the semiconductor wafer in the microscope measuring instrument;

moving a position of the at least one alignment mark into the beam path of the optical lens system by using the movable substrate holder; and switching on the second light source and exposing the first resist layer in the region above the at least one alignment mark.

3. The method according to claim 1, which comprises providing the microscope measuring instrument such that the microscope measuring instrument is configured to determine a density of defects on the semiconductor wafer.

4. The method according to claim 1, which comprises providing the microscope measuring instrument such that the microscope measuring instrument is configured to perform an inspection of defects on the semiconductor wafer.

5. The method according to claim 2, which comprises performing the step of exposing the first resist layer without projecting a mask structure onto the semiconductor wafer.

6. The method according to claim 1, which comprises providing a light beam produced by one of the first light source and the second light source on a surface of a resist such that the light beam has an extent of more than 1 μm and of less than 400 μm.

7. The method according to claim 1, which comprises providing the first resist layer as a layer being photosensitive to light in a wavelength range between 193 nm and 365 nm.

* * * * *